United States Patent [19]

Heath et al.

[11] Patent Number: 4,688,072

[45] Date of Patent: Aug. 18, 1987

[54] HIERARCHICAL CONFIGURABLE GATE ARRAY

[75] Inventors: Herbert E. Heath, Los Angeles; Jay M. Block, Thousand Oaks, both of Calif.

[73] Assignee: Hughes Aircraft Company, Los Angeles, Calif.

[21] Appl. No.: 882,446

[22] Filed: Jul. 7, 1986

Related U.S. Application Data

[63] Continuation of Ser. No. 626,086, Jun. 6, 1984.

[51] Int. Cl.[4] .................. H01L 27/10; H01L 27/02; H01L 23/48; H01L 29/52
[52] U.S. Cl. ..................................... 357/45; 357/40; 357/70; 357/68; 364/491
[58] Field of Search ................ 357/45, 40, 70, 68; 364/491

[56] References Cited

U.S. PATENT DOCUMENTS

| | | | |
|---|---|---|---|
| 3,621,562 | 11/1971 | Patel | 357/40 |
| 3,638,202 | 1/1972 | Schroeder | 357/40 |
| 3,749,985 | 7/1973 | Dawson | 357/40 |
| 3,750,055 | 7/1973 | Funck | 357/40 |
| 4,412,237 | 10/1983 | Matsumura et al. | 357/45 |

OTHER PUBLICATIONS

Patents Abstracts of Japan, vol. 7, No. 40 (E-159)(1185), Feb. 17, 1983, (Tokyo, JP) & JP, A, 57192061 (Hitachi Seisakusho K.K.).
Patents Abstracts of Japan, vol. 8, No. 123 (E-249)(1560), Jun. 8, 1984, (Tokyo, JP) & JP, A, 59145678 (Nippon Denki K.K.).
IBM Technical Disclosure Bulletin, vol. 20, No. 8, Jan. 1978, B. C. Fox et al., "Large-Scale Integration Modeling Technique", pp. 3129-3130.
IEEE Journal of Solid State Circuits, vol. SC-16, No. 5, Oct. 1981, F. Borgini et al., "CMOS/SOS Automated Universal Array", pp. 563-570.

Primary Examiner—Martin H. Edlow
Assistant Examiner—Robert P. Limanek
Attorney, Agent, or Firm—Lewis B. Sternfels; A. W. Karambelas

[57] ABSTRACT

A hierarchical configurable gate array is disclosed and includes a plurality of cluster regions (10,20,30,40) arranged in different levels. The first level cluster (10) includes an integral number N multi-terminal components for providing canonical functions. The second level cluster (20) includes N first level clusters; and higher level clusters (30,40) each includes N clusters of the next lower level. Interconnect regions (13,15,17,19) are provided within each cluster for interconnections between the N elements of each level. Selected input or output ports for each element of a cluster are available for interconnection at more than one location.

10 Claims, 5 Drawing Figures

HIERARCHICAL CONFIGURABLE GATE ARRAY

This is a continuation of application Ser. No. 626,086, filed June 6, 1984.

BACKGROUND OF THE INVENTION

1. Field of the Invention

The disclosed invention generally relates to configurable gate arrays (CGA's), and is particularly directed to a configurable gate array which utilizes hierarchical cluster levels.

2. Description of Background Art

In the semiconductor industry two principal design approaches are utilized in the design and manufacture of integrated circuits; namely, custom logic and semicustom logic.

Custom integrated circuits typically involve expensive custom design to provide a one-of-a-kind integrated circuit for specific functions. While extremely costly to design, such custom integrated circuits are typically intended for large quantity production.

A semicustom integrated circuit generally utilizes a "standardized" integrated circuit chip which includes a plurality of individual circuit elements arranged in arrays. The integrated circuit chip is then adapted to provide desired electrical functions by selectively interconnecting the circuit elements. For example, such interconnections may be accomplished by appropriate metalization processing. A "standardized" integrated circuit chip is basically a foundation on which the desired logic functions are achieved by selective interconnections of the circuit elements.

One form of semicustom logic design and manufacture is based on integrated circuit gate arrays produced by different companies. Generally, an integrated circuit gate array includes a plurality of individual logic gates arranged in arrays which typically are not interconnected. The desired logic functions are then achieved by selective interconnection of the inputs and outputs of the gates. As the number of gates in a gate array increases, i.e., as gate density increases, interconnection routing rapidly becomes more complex and difficult. As a result of interconnection difficulties the gate utilization factor, i.e., the percentage of gates actually utilized, decreases.

While several major types of configurable gate arrays have been developed in attempts to improve routability and utilization such configurable gate arrays currently have substantial disadvantages and limitations.

For example, in channel routed arrays, wherein channels for interconnections are provided between groups of gates, an upper limit of about 3,500 gates is reached. Moreover, routing distances become excessively long.

In prior art gate arrays wherein gates are uniformly distributed, routing tends to be unstructured and limited by spacing between the gates. It is believed that such a uniformly distributed gate array has an upper limit of about 1,000 gates.

In prior art arrays wherein gates are not uniformly distributed, routing also tends to be unstructured and limited by the widths of the routing channels.

Another type of prior art gate array includes logic gates and dedicated "macros" which are functional circuits (e.g., flip-flops) made from preconnected logic gates. Since the circuit elements for the macros are dedicated to specific functions, such circuit elements can be efficiently packed. Such arrays have an upper limit of about 6,000 gates. Increasing the number of gates would require larger macros which would limit the potential applicability of such an array. Thus, the gates/macros approach is believed to be self-limiting.

As is readily evident from the foregoing described prior art, interconnection routing and space constraints present significant limitations relative to increasing gate density while maintaining a high level of gate utilization.

SUMMARY OF THE INVENTION

It is therefore an object of the invention to provide an improved configurable gate array.

Another object of the invention is to provide an improved configurable gate array wherein the areas of the interconnect regions are minimized.

Still another object of the invention is to provide a hierarchical configurable gate array which includes increasingly larger gate cluster levels, and wherein the area of interconnect regions for the interconnection between clusters of the same level increase as the level increases.

A further object of the invention is to provide a hierarchical configurable gate array wherein a given gate cluster level forms a component of the next higher gate cluster level.

Another object of the invention is to provide a hierarchical configurable gate array having cluster levels of respectively increasing numbers of gates, and wherein the respective areas of the interconnect regions are determined as a function of the respective levels of interconnection.

Still another object of the invention is to provide a hierarchical configurable gate array having cluster levels wherein each level can assume the identity of a component having inputs and outputs.

The foregoing and other objects and features are achieved in a configurable gate array having a first level cluster comprising N multi-terminal circuit components, wherein each component provides a canonical function and N is an integer; a second level cluster comprising N first level clusters; and further level clusters wherein each level cluster includes N clusters of the next lower level. Each of the N circuit components or clusters is an element of its respective level cluster, and interconnect regions are provided for interconnection between the N elements of a level cluster. The respective areas or sizes of such interconnect regions depend on the cluster level formed by the elements to be interconnected within each cluster. Selected input or output ports for each element are available at more than one location for interconnection between the elements of such cluster.

BRIEF DESCRIPTION OF THE DRAWING

The foregoing and other advantages and features of the invention will be understood by persons skilled in the art from the following detailed description when read in conjunction with the drawing wherein.

DETAILED DESCRIPTION OF THE INVENTION

Figure 1:
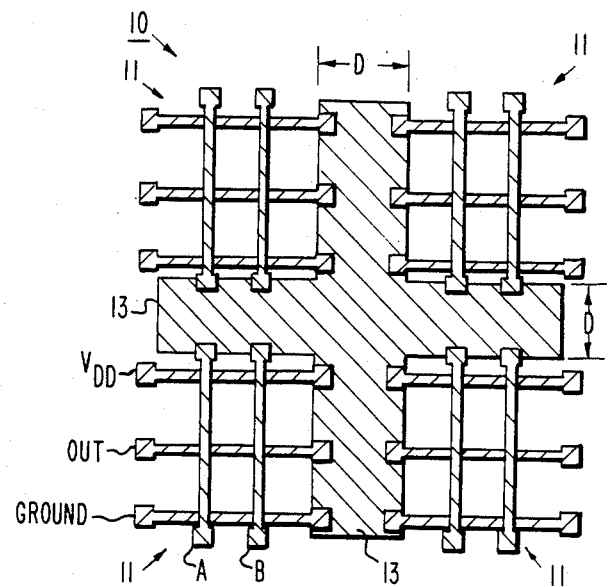
FIG. 1 is a top plan schematic view illustrating the first level cluster of the disclosed hierarchical configurable gate array, the elements forming the first level cluster, and the interconnect region for the elements.

In the following description and in the several figures of the drawing, like elements are identified by like reference numerals.

Referring to FIG. 1, shown therein is a top plan schematic view of a grouping referred to herein as a level 1 cluster 10. The level 1 cluster includes four (4) elements 11 distributed about a cruciform shaped interconnect region 13. The width across each area of the cruciform is identified as "D". Each of the level 1 which provides a canonical function. Examples of such multi-terminal circuit components include NAND gates and NOR gates. Each of the level 1 cluster elements 11 may be different compnents. However, for ease of reference, the level 1 cluster elements 11 will be generally discussed as being identical and will also be generally discussed as gates.

The X and Y axes adjacent the level 1 cluster 10 identify reference directions which will be utilized in the description of the level 1 cluster 10 as well as all other clusters of different levels. The cruciform shaped interconnect region 13 of the level 1 cluster 10 and the interconnect regions described below have arms extending in the X and Y directions.

Figure 3:
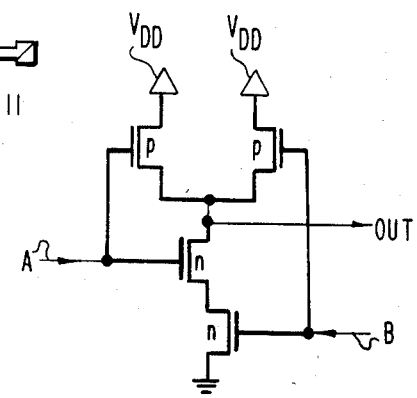
FIG. 3 is a schematic diagram of a NOR gate which by way of example can be an element of the first cluster level of FIG. 1.
Figure 2:
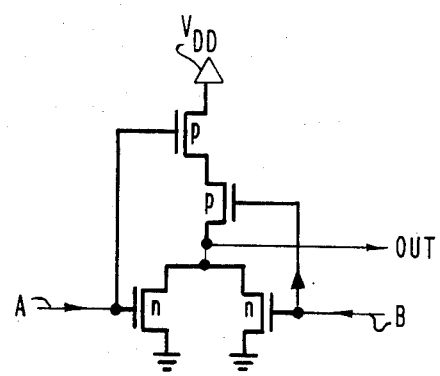
FIG. 2 is a schematic diagram of a NAND gate which by way of example can be an element of the first cluster level of FIG. 1.

By way of preferred example, the disclosed configurable gate array utilizes complementary metal-oxide semiconductor (CMOS) technology. FIG. 2 illustrates a typical NAND gate in CMOS form. FIG. 3 illustrates a typical NOR gate in CMOS form. These examples can be fabricated using any semiconductor technology other than CMOS, such as integregated injection logic (IIL), emitter coupled logic (ECL) and N-channel MOS (NMOS). In FIGS. 2 and 3, the "n" and "p" designations respectively identify the n-channel and p-channel transistors; $V_{DD}$ is the supply voltage; A and B are inputs; the ground symbol identifies the common ground system; and OUT identifies the output.

Referring again to FIG. 1, each level 1 element 11 is schematically shown by elongated input/output (I/$\theta$) contacts which are identified in conformity with FIGS. 2 and 3. Specifically, $V_{DD}$ identifies the contact for the supply voltage $V_{DD}$ GROUND identifies the ground contact; A and B identify the gate inputs; and OUT identifies the gate output.

Each element 11 is regarded as having four sides defined by the ends of the elongated I/$\theta$ contacts identified previously. Such four sides form the periphery of each respective element 11. The elongated I/$\theta$ contacts of the level 1 elements 11 illustrate the principle of "multiporting" as utilized in the invention. Each I/$\theta$ contact on a particular side of a level 1 element 11 is available on the opposite side. Thus, each I/$\theta$ contact of each level 1 element 11 is accessible on the level 1 interconnect region 13.

Similarly, the level 1 cluster 10 also has a periphery formed by the four sides defined by the outermost contacts. Since the level 1 cluster is an element of the level 2 cluster (discussed below), each I/$\theta$ contact of the level 1 cluster that is to be connected to another cluster is preferably available on two sides, and preferably on opposite sides. The same multiporting principle is applied to higher cluster levels.

Multiporting achieves the accessibility of each contact or function on two sides of the cluster element region, and also forces connections between clusters of the same level to originate at the periphery of each cluster. While accessiblity of I/$\theta$'s on opposite sides of an element is preferred, it is not necessary that the placement of the I/$\theta$ contacts on one side be a mirror image of the I/$\theta$ contacts on the opposite side. Stated another way, multiporting provides as to each element or cluster a rotation-like capability about the X and Y axes which is utilized without actual rotation.

In conjunction with multiporting, the interconnections between the level 1 elements 11 must be located within the interconnect region 13 of the level 1 cluster. This requirement allows the level 1 cluster, as well as each higher level cluster, to assume the characteristics of a separate circuit component with only I/$\theta$ contacts located about its periphery. As will be evident from further discussion, each cluster is like a "black box" for providing functions which are accessible at the multiported I/$\theta$ contacts located about its periphery.

Multiporting in the level 1 and higher clusters is achieved by appropriate interconnection between elements of each cluster. For various design reasons, multiporting may not always be feasible or practical or beneficial. Accordingly, the requirement of multiporting can be relaxed to some degree by determining in the actual application design process which I/$\theta$'s for each cluster do not require the accessibility provided by multiporting. Any requirement of multiporting referred to herein is subject to this qualification.

Figure 4:
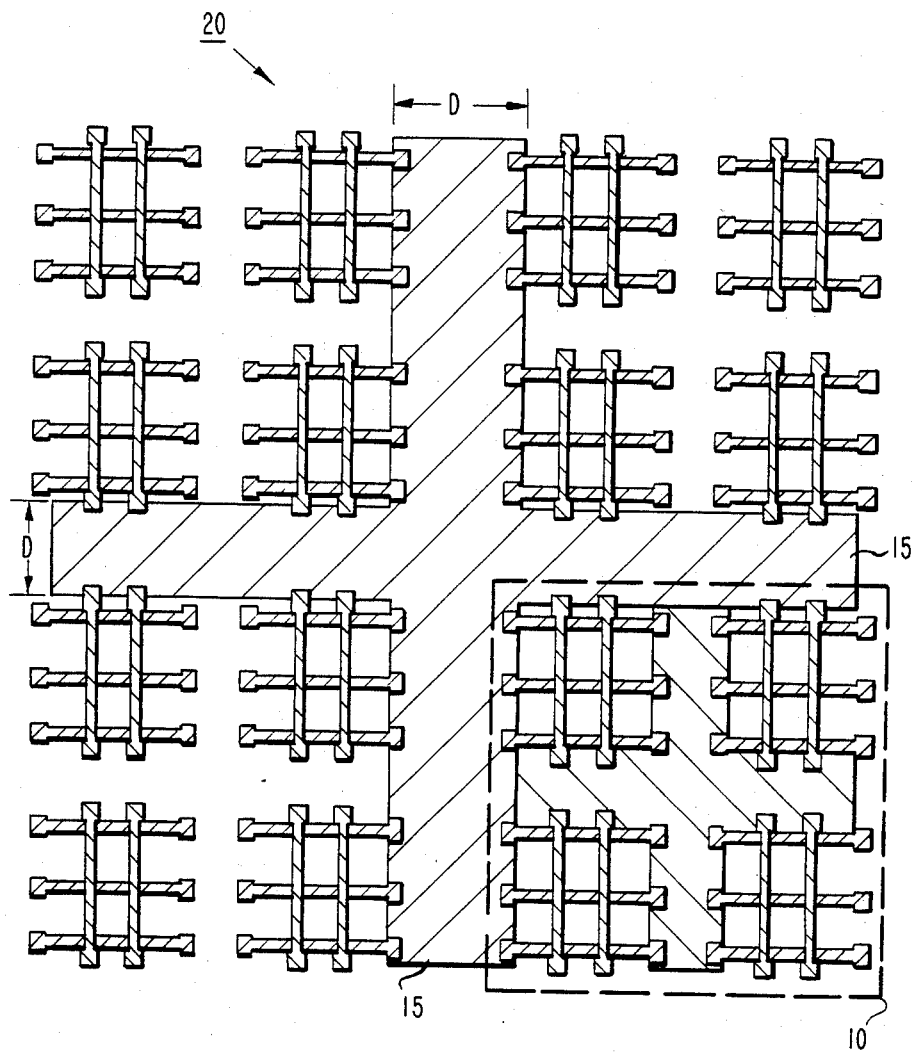
FIG. 4 is a top plan schematic view of the second level cluster of the disclosed hierarchical configurable gate array, the elements forming the second level cluster, and the interconnect region for the elements.

Referring now to FIG. 4, shown therein is a top plan schematic view of a level 2 cluster 20 which includes as its elements four (4) level 1 clusters 10 distributed about a cruciform shaped level 2 interconnect region 15. As with respect to the level 1 cluster 10, the I/$\theta$ contacts of the level 2 cluster are located about the periphery of the level 2 cluster region and are multiported. Also, the interconnects between the level 2 elements (the four (4) level 1 clusters 10) must be located within the level 2 interconnect region 15.

Figure 5:
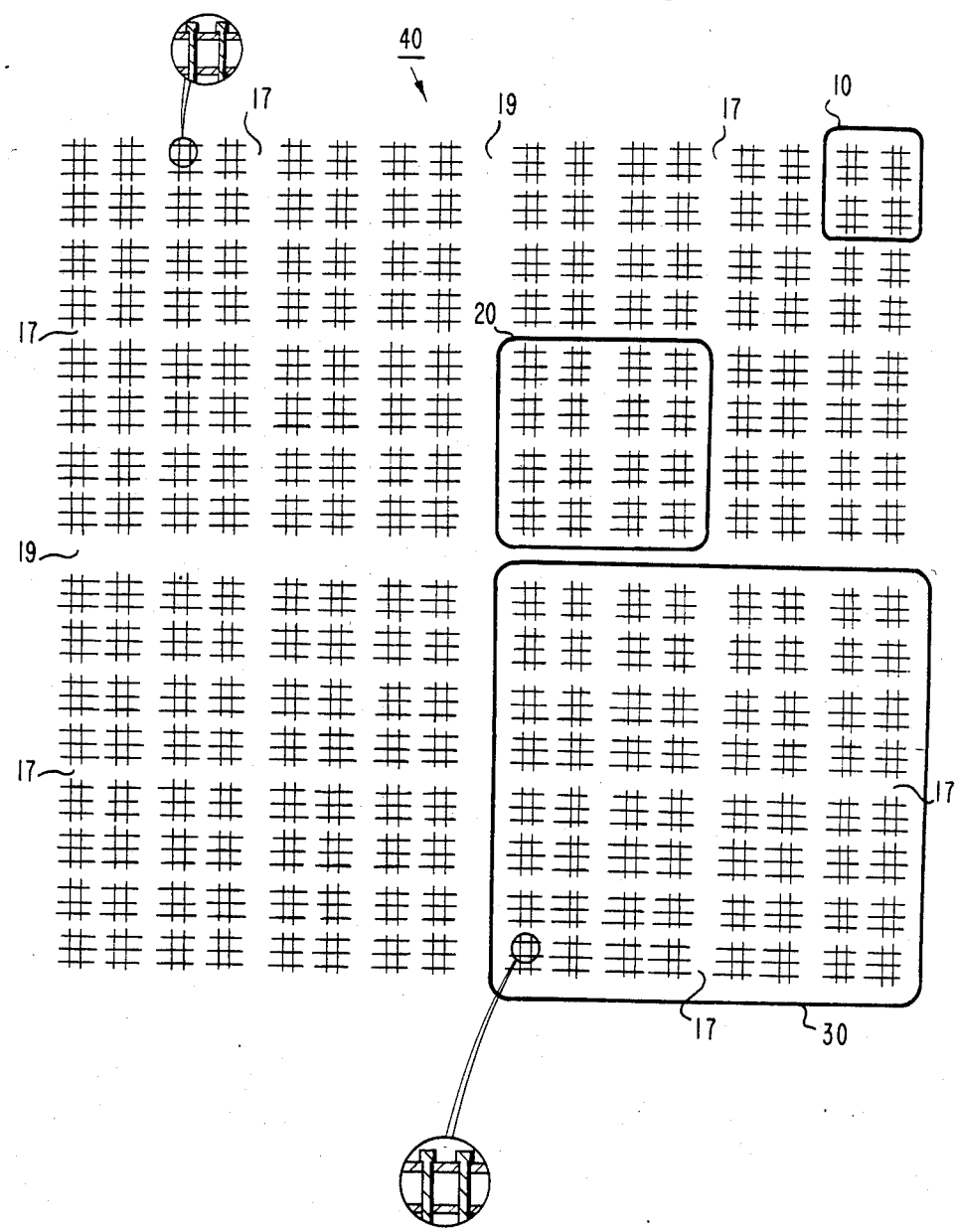
FIG. 5 is a top plan schematic view of the fourth level cluster of the disclosed hierarchical configurable gate array and the third level cluster which form the elements of the fourth level cluster.

Referring now to FIG. 5, shown therein are four (4) level 3 clusters 30 which form the elements of a level 4 cluster 40. Each level 3 cluster 30 includes four (4) level 2 clusters 20 as elements, and also includes a cruciform shaped level 3 interconnect region 17. As with the previously discussed level 1 and level 2 clusters, all interconnections between the level 3 cluster 30 elements (i.e., four level 2 clusters) must be located within the interconnect region 17 of the level 3 cluster 30. Also, as with the previously discussed level 1 and level 2 clusters, the I/$\theta$ contacts of the level 3 cluster 30 are located around the periphery of the region occupied by the level 3 cluster, and such level 3 cluster I/$\theta$ contacts are multiported.

A level 4 cluster 40 includes as its elements four (4) level 3 clusters 30, and also includes a cruciform shaped level 4 interconnect region 19. All interconnections between the level 4 elements (i.e., four (4) level 3 clusters 30) must be located within the interconnect region 19 of the level 4 cluster 40. The I/θ contacts for the level 4 cluster 40 are located around the periphery of the region occupied by the level 4 cluster 40, and such level 4 cluster I/θ contacts are multiported.

Higher level clusters are provided in accordance with the foregoing principles. Thus, each higher level cluster includes four elements, each element being a preceding level cluster. The elements of each cluster are arranged around a cruciform shaped interconnect area, and all interconnections between the four elements of a cluster must be made within the interconnection area. The I/θ contacts for each level cluster are located about the periphery of the region occupied by such cluster, and the contacts are multiported.

As can be readily understood, the foregoing principles for cluster organization are quite rigid, but provide for a truly hierarchical structure. Each level cluster is forced to have specific characteristics which enables it to be utilized as an element of the next higher level.

The hierarchical structure is advantageously utilized in the implementation of specific logic designs by partitioning the various cluster levels into predetermined functional groups or libraries. For example, a level 2 cluster 20 could include sixteen (16) gates (since each level 1 cluster 10 could include four (4) gates) and can be considered a primitive cell. By appropriate interconnections, such a primitive cell can provide functions generally associated with small-scale integrated (SSI) circuits, including flip-flops and latches. From a logic design viewpoint, the primitive cell can be considered the basic resource for a logic designer.

A level 3 cluster 30 would include four (4) primitive cells and, therefore, sixty-four (64) gates. A level 3 cluster 30 could provide functions generally associated with medium-scale integrated (MSI) circuits, including registers, arithmetic logic units (ALU's), and adders.

The discussion of functions associated with SSI and MSI circuits are specific examples illustrating the previously discussed characteristic that each cluster can be regarded as a separate component for providing electrical function which are available at the I/θ contacts distributed about its periphery. As higher order logic functions are required, higher level clusters are utilized.

The areas of the interconnect regions 13,15, and so forth, increase with cluster level since the number of gates (i.e., level 1 cluster elements 11) in a cluster increases with the cluster level. More significantly, to the extent that I/θ contacts increase with increasing cluster level, the areas of the cruciform shaped interconnect regions must increase accordingly.

The areas for interconnection would also depend on the specific interconnection structure. For example, the X-Y orientation of the interconnect regions readily allows for respective parallel conductor tracks in the X and Y directions. Such tracks can be provided by deposition of two (2) insulated metal layers. As discussed above, the interconnections between the elements of each cluster are contained within the interconnection region for such cluster. Also, each cluster has its I/θ contacts distributed about the region occupied by such cluster. Thus, each cluster has associated conductor tracks in its interconnect region which are solely for interconnecting the elements of such cluster.

The number of tracks in the respective interconnect regions will depend on the number of I/θ contacts that exit on the interconnect region. By way of example, it has been determined as a "rule of thumb" that the number of tracks in each direction (X and Y) is equal to the number of I/θ contacts that exit from one element to the interconnect region. Assuming complete multiporting, the number of tracks in a given direction (X or Y) is equal to the number of distinct I/θ functions for one element.

To some degree, the foregoing assumes that each side of a cluster element has the same number of I/θ contacts. Therefore, the number of tracks are the same in both X and Y directions for a given interconnect region. To the extent that one side of an element may have more or less I/θ contacts than an another side, the number of tracks in a given direction and adjacent such side of the element may be reduced or increased, respectively.

The number of distinct I/θ functions for a given cluster element can be determined by design, empirically or by reference to known mathematical models which provide "gate-to-pin" calculations.

The number of tracks directly affects the width D of each interconnect region, as does the center-to-center spacing W of the tracks. Expressed in terms of the number of I/θ functions N provided by an element, the width D of the interconnect region is as follows:

$$D = N \times W \qquad \text{(Equation 1)}$$

In terms of area, for a cluster element having a side length L, the area A of the interconnect region is as follows:

$$A = D^2 + 4DL \qquad \text{(Equation 2)}$$

While the foregoing discussion of the interconnect region has been in the context of the number of distinct I/θ functions of a cluster element, the number of tracks utilized can also be determined empirically from an inspection of interconnection requirements. By way of example, the following numbers of tracks for each direction have been found appropriate:

TABLE I

| Interconnect Region For | Number of Tracks In Each Direction |
| --- | --- |
| Level 1 Cluster | 3 |
| Level 2 Cluster | 6 |
| Level 3 Cluster | 10 |
| Level 4 Cluster | 25 |
| Level 5 Cluster | 32 |
| Level 6 Cluster | 50 |

To the extent that the number of conductor tracks of each cluster is determined other than by the above-described rule of thumb, then the width D of an interconnect region is calculated in accordance with Equation 1 by substituting the number of tracks for N in such equation. After the width D is determined, then the area A can be evaluated in accordance with Equation 2.

The foregoing described cluster system provides a hierarchical configurable circuit array wherein each cluster includes four elements that are interconnected in an interconnect region that is within the four-sided region occupied by the cluster, and further includes I/θ contacts which are distributed about its periphery. Some or all of the I/θ contacts are multiported, by which such multiported contacts are available on more than one side of the cluster. Thus, each cluster can be considered a component which provides electrical functions as defined by the interconnections of the elements of the cluster. Further, prior to interconnection all clusters of the same level are identical and therefore allow design flexiblity as to the placement of defined I/θ functions.

The described hierarchical structure is independent of the process technology utilized and requires only the provision of the two metalization layers for the X and Y tracks for the interconnect regions. The areas of such interconnect regions are minimized by having element-to-element interconnections contained within the cluster region and having multiported I/θ contacts distributed about the periphery of the cluster region.

While the foregoing description has been directed to specific embodiments of the invention, modifications and changes thereto can be readily made by persons skilled in the art without departing from the scope and spirit of the invention as defined by the following claims.

What is claimed is:

1. An hierarchical gate array comprising:
   at least three clusters of increasing level and size, each cluster having logic gates grouped in a plurality of cluster elements where the number of gates in a cluster increases with cluster level;
   respective interconnect regions within each cluster for accommodating selected interconnections between cluster elements, said selected interconnections defining respective cluster functions for each said cluster and said interconnect regions having respective areas related to the respective number of gates in respective clusters;
   respective input/output means located about the periphery of each cluster for providing access to the cluster functions of respective cluster regions; and
   wherein each higher level cluster above the first level cluster includes as its cluster elements a plurality of lower level clusters separated by a respective interconnect region which accommodates interconnections between the respective input/output means of said lower level clusters.

2. The hierarchical gate array of claim 1 wherein each said respective input/output means provides access to its associated cluster functions at more than one location on the periphery of its associated cluster, whereby said cluster functions that are available at more than one locations are considered to be multiported.

3. The hierarchical gate array of claim 2 wherein each said cluster includes four cluster elements and occupies a four-sided region, and wherein said interconnect area is of a cruciform shape and separates said four cluster elements.

4. The hierarchical gate array of claim 3 wherein said multiported cluster function are available on opposite sides of respective clusters.

5. The hierarchical gate array of claim 1 wherein said interconnect regions have respective configurations which are unaffected by the specific technology used in fabricating said cluster elements.

6. An hierarchical gate array comprising:
   a plurality of first level clusters each having four logic gates as first level cluster elements, said elements of each first level cluster being arranged in a four-sided region and separated by a first level interconnect region within said four-sided region;
   a plurality of second level clusters each having four of said first level clusters as second level cluster elements, said elements of each second level cluster being arranged in a second level four-sided region and separated by a second level interconnect region within said second level four-sided region;
   a third level cluster having four of said second level clusters as third level cluster elements, said elements being arranged in a third level four-sided region and separated by a third level interconnect region within said third level four-sided region;
   said first, second and third level interconnect regions for respectively accommodating selected interconnections between cluster elements of respective clusters which define respective cluster functions for each cluster, and having respective areas related to the respective number of gates in respective clusters; and
   respective input/output means for each of said first, second, and third level clusters for respectively providing access to cluster functions of respective cluster regions.

7. The hierarchical gate array of claim 6 wherein each said respective input/output means provides access to its associated cluster functions at more than one location on the periphery of its associated cluster, whereby said cluster functions that are available at more than one locations are considered to be multiported.

8. The hierarchical gate array of claim 7 wherein each said interconnect area is of a cruciform shape and separates said four cluster elements.

9. The hierarchical gate array of claim 8 wherein said multiported cluster functions are available on opposite sides of respective clusters.

10. The hierarchical gate array of claim 6 wherein said interconnect regions have respective configurations which are unaffected by the specific technology used in fabricating said cluster elements.

* * * * *